(12) United States Patent
Hata et al.

(10) Patent No.: US 8,003,193 B2
(45) Date of Patent: Aug. 23, 2011

(54) FUNCTIONAL DEVICE

(75) Inventors: Shohei Hata, Yokohama (JP); Eiji Sakamoto, Fujisawa (JP); Naoki Matsushima, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 932 days.

(21) Appl. No.: 11/924,924

(22) Filed: Oct. 26, 2007

(65) Prior Publication Data
US 2008/0233349 A1 Sep. 25, 2008

(30) Foreign Application Priority Data
Oct. 27, 2006 (JP) ................... 2006-292598

(51) Int. Cl.
*B32B 3/24* (2006.01)
*B32B 17/06* (2006.01)
(52) U.S. Cl. ............ 428/131; 428/336; 428/539.5; 428/428; 428/432; 428/433; 156/272.2
(58) Field of Classification Search .......... 428/131, 428/336, 539.5, 428, 432, 433; 156/272.2
See application file for complete search history.

(56) References Cited

U.S. PATENT DOCUMENTS
7,153,758 B2 * 12/2006 Hata et al. .................... 438/455

FOREIGN PATENT DOCUMENTS

| JP | 06-343017 | 12/1994 |
|----|-----------|---------|
| JP | 2004-248243 | 9/2004 |
| JP | 2004-262698 | 9/2004 |
| JP | 2005-055790 | 3/2005 |
| JP | 2005-309174 | 11/2005 |
| WO | WO 2006/104265 | 10/2006 |

OTHER PUBLICATIONS

Ruby R.C., "Digest of Technical Papers 2002; IEEE International Solid-State Circuits conference 0-7803-7335-9/2002 IEEE pp. 184-185, Session No. 11.3"High-Q FBAR Filters in a Wafer-level Chip-Scale Package; (10 pages).

"Visuals Supplement 2002 to the Digest of Technical Papers;" IEEE International Solid-State Circuits conference 0-7803-7335-9/2002, vol. Forty-Five. (10 pages).

* cited by examiner

*Primary Examiner* — William P Watkins, III
(74) *Attorney, Agent, or Firm* — Antonelli, Terry, Stout & Kraus, LLP.

(57) ABSTRACT

The present invention provides a low-cost MEMS functional device by improving air tightness of a jointed section by anode junction in wafer level packaging for MEMS based functional devices. The MEMS functional device comprises a function element section formed by processing a substrate mainly made of Si, a metallized film for sealing formed around the functional element, and a glass substrate jointed to the metallized film for sealing by anode junction. Formed on a surface of the metallized film for sealing is a metallized film containing at least one of Sn and Ti as a main component.

6 Claims, 7 Drawing Sheets

FUNCTIONAL DEVICE

CLAIM OF PRIORITY

The present application claims priority from Japanese application JP2006-292598 filed on Oct. 27, 2006, the content of which is hereby incorporated by reference into application.

BACKGROUND OF THE INVENTION

1. Field of the Invention

The present invention relates to a functional device based on the MEMS (Micro Electro Mechanical Systems). The MEMS is used for manufacturing high-frequency filters, various sensors, actuators, and the like by etching a substrate including Si as a main component.

2. Description of the Related Art

In the field of MEMS, functional devices such as high-frequency sensors, acceleration sensors, angular velocity sensors, and actuators are manufactured by processing a base material including Si as a main component using the etching technique. The base material may comprise a Si wafer or a wafer including an insulating layer (the wafer is called as SOI (Silicon on Insulator)).

A SAW (Surface Acoustic Wave) filter is typically used for a typical high-frequency filter used for cellular phone and the like. Recently, a FBAR (Film Bulk Acoustic Resonator) filter is also used. When the SAW filter is manufactured, a functional device is formed on a substrate of a piezoelectric element, while a functional device in the FBAR filter is manufactured by forming a piezoelectric membrane on a substrate including Si as a main component. To ensure property and reliability of the functional device in these high-frequency filters, the function element section needs to be sealed air-tight.

In sensors for acceleration based on the MEMS, a first method of forming a functional element is to measure acceleration loaded to an entire device from a change in movement of the functional device. In this case, a spindle-shaped or comb-like electrode is used through etching. In a second method, acceleration is read from a change in resistance generated because of distortion loaded to a resistor previously formed on a beam. In this case, a through-hole is provided by etching a substrate containing Si as a main component, and a spindle is held via a thin beam to form a resistor on the beam. Even in either method is adopted, because movement of an electrode or a spindle is influenced by an air pressure within a package, air-tight sealing for the package is required. Furthermore there has been developed, as a third method, a method for detecting acceleration by measuring temperature distribution within the functional device with a temperature sensor. In this case, a hollow structure is formed on a substrate containing Si as a main component, and a thin, net-like beam is formed on the hollow structure. A temperature sensor is formed at a prespecified position on the beam, while a heat source is formed on a portion of the beam. Thus, in the state where a gas inside the package is heated by the heat source, when acceleration is loaded, the gas flows in the package. By measuring the temperature distribution in such a state, the loaded acceleration is detected. Also in the functional device having the configuration as described above, air-tight sealing is required for the package.

In any case, air-tight sealing for the package is indispensable for maintaining the performance in sensors having a movable section like the MEMS or a high-frequency filter.

Examples of a conventional technique for providing air-tight sealing include a method in which a functional device is provided on a ceramic package and a cover made of metal, ceramics, glass or the like is connected to the functional device with solder or glass having a lower melting point. In the methods, however, the functional device is packaged discretely.

Recently, contemplation of completing air-tight sealing for the MEMS functional device in a wafer state has been made as a method of reducing the packaging cost for the MEMS-based functional device. To achieve the objective, it is necessary to joint another water to a substrate containing Si as a main component with a functional device formed thereon and seal the jointed portion air-tight. Such an example is described, for instance, in DIGEST OF TECHNICAL PAPERS 2002:IEEE International Solid-State Circuits Conference 0-7803-7335-9/02/2002 IEEE (Non-patent document 1)

SUMMARY OF THE INVENTION

A method of air-tight sealing a functional device by means of wafer junction is disclosed in the example described in Non-patent document 1. In this method, the following processing sequence is employed. Namely, Au is plated with large thickness along an outer periphery of a functional device on an Si wafer, another Si wafer is laid over the former Si wafer, and the laminated body is heated to the eutectic temperature of Au—Si (361° C. or more) under pressurization. Thus an Au—Si eutectic melt body is formed to joint the two Si wafers to each other. However, this method needs to form a pattern of a sealing section with a large thickness on a wafer by AU plating, resulting in increase of use of Au. Therefore, the cost is disadvantageously high.

With the present invention, it is possible to suppress an amount of used precious metals such as Au, and to form a low-cost metal film (referred to as a metallized film, because the technique is called as metallizing in the technical field) along an outer periphery of a functional device for jointing another wafer thereto for air-tight sealing.

A main feature of the present invention is that a metallized film for sealing is formed along the outer periphery of a functional device and a glass substrate is jointed to the metallized film for sealing via anode junction. The metallized film for sealing is formed by forming a metallized film containing Al as a main component on the surface and furthermore forming a metallized film containing at least one or both of Sn and Ti to form a laminated body.

In general, a substrate with at least its surface made of Si is used to form a functional device. More specifically, an Si substrate or an SOI substrate is used for that purpose. In the configuration, a reaction product layer generated when the substrate with at least its surface made of Si, the first metal film for sealing, and the glass substrate are jointed to each other via anode junction is formed on an interface between the first metal film for sealing and the glass substrate after completion of the anode junction. Because of the feature, sufficient sealing can be performed. After completion of the anode junction, a reaction product layer is formed also in other embodiments described below.

In a representative example of the first metal film for sealing, a laminated body of at least a metal film containing Al as a main component and a metal film containing Ti as a main component is used. In this case, a reaction product layer generated during anode junction is formed between the laminated body of the metal films and the glass substrate. The reaction product layer may be referred to as "metallized film" containing Ti as a main component.

In another example of the first metal film for sealing, a laminated body of at least a metal film containing Al as a main component and a metal film containing Sn as a main component is used. In this case, a reaction product layer generated during anode junction is formed between the metal film containing Al as a main component and the glass substrate. This reaction product layer may be referred to as metallized film containing Sn as a main component.

In still another example of the first metal film for sealing, a laminated body of at least a metal film containing Al as a main component and a metal film containing a Ti layer, an Au layer, and Sn as main components is used. In this case, a reaction product layer generated during anode junction is formed between the metal film containing Al as a main component and the glass substrate. This reaction product layer may be referred to as compound film containing at least one of Al, Ti, and Sn.

It is practically useful to provide a layer for adhesion to the first metal film for sealing on the substrate. A representative example of the configuration is a Ti film.

Connection of electrodes to the outside is performed as described below. Namely, at first electrodes are formed with the same metallized film on the wafer on which the functional device is formed. Then a through-hole is provided on the glass substrate, and positioning is performed so that the through-hole is positioned inside the electrode. In this state, the glass substrate around the through-hole is connected to the electrode metallized film by means of anode junction for air-tight sealing, thus the electrodes being made connectable to the outside.

A representative example of the configuration is as described below. Namely, the glass substrate has a through-hole provided on an inner surface of the first metal film for sealing surrounding the functional element, and furthermore a metal film for wiring is formed on the substrate with at least its surface made of Si, and metal film for wiring is electrically connected to the functional device. Furthermore a second metal film for sealing is formed in contact with the metal film for wiring.

The second metal film for sealing is associated with the through-hole on the glass substrate in a plane position with respect to the substrate. In the state where the function element section and the glass substrate face each other, the substrate with at least the surface made of Si and the glass substrate are jointed to each other by means of anode junction via the second metal film for sealing, and at the same time, a reaction product layer generated during anode junction among the substrate with at least its surface made of Si, the first and second metal films for sealing, and the glass substrate is formed on an interface between the first and second metal films for sealing and the glass substrate.

With the present invention, it is possible to provide a functional device based on low-cost MEMS, because the functional device based on MEMS can be sealed air-tight in batch on a wafer.

DETAILED DESCRIPTION OF THE PREFERRED EMBODIMENTS

Figure 1:
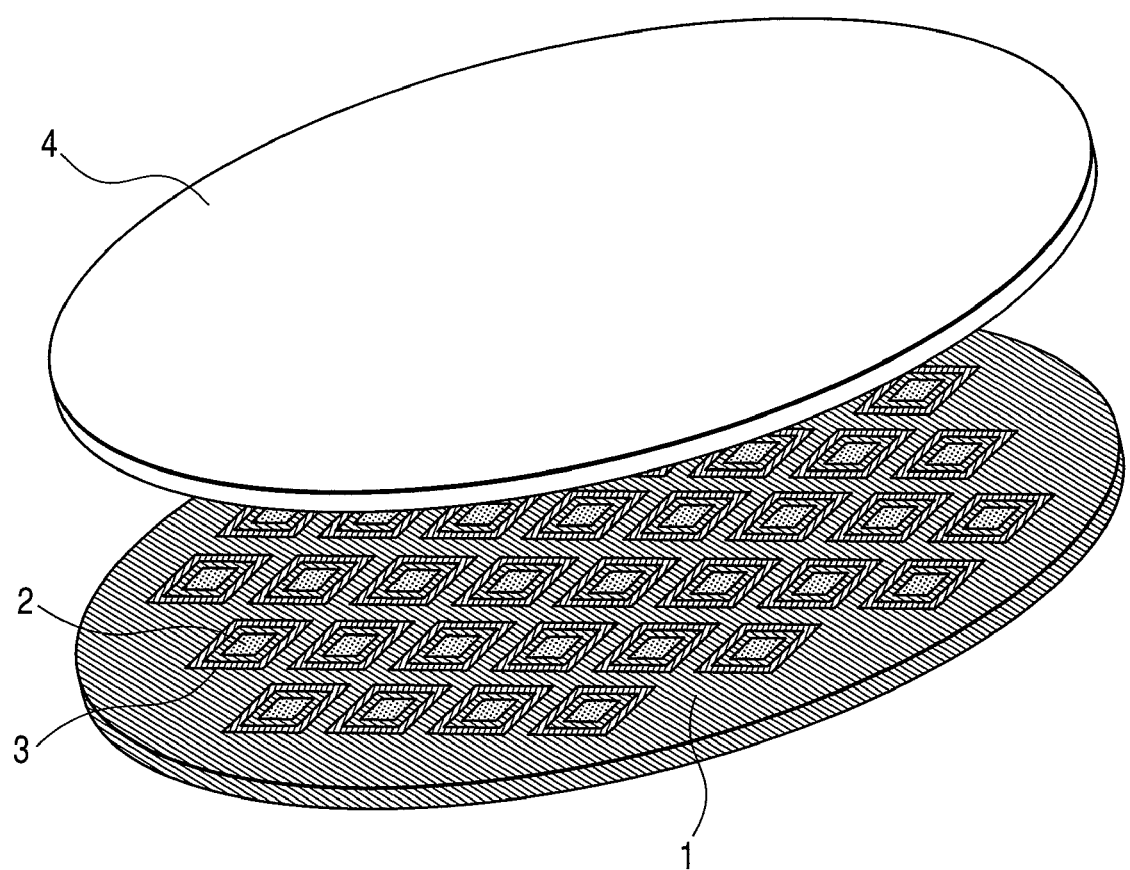
FIG. 1 is a perspective view illustrating outline of wafer-level packaging of a functional device according to the present invention.

Embodiments of the present invention are described below, and at first the metallized film is described in detail. Preferably pure Al is generally used as a component of the Al metallized film. However, other elements may be added for controlling hardness of the Al metallized film and crystallization thereof. In this case, a content of other elements added therein should be 10% by weight or below so that a content of Al is 90% by weight or more. When other elements are added to the Al metallized film by 10% by weight or more, alloys and compounds of the elements are generated, and the surface roughness of the Al metallized film may disadvantageously becomes larger. The other elements added in a metallized film for controlling hardness or crystallization thereof include Ti, Cr, V, W, Cu, Ni, Fe and the like. Sometimes at least one of the elements is added to the Al metallized film to satisfy the actual necessity. It is needless to say that there are the cases in which the layers of Ti, Sn, Au or the like contain impurities.

The thickness of the Ti layer to be formed on the Al metallized film is basically to be made larger than those of concave and convex sections on a surface of the Al metallized film. The reason is that Ti is dispersed in glass during anode junction and projected portions of the Ti layer are peeled off while junction is being made. For completely eliminating the projected portions and leaving Ti in the entire region until junction is completed in the entire surface of the metallized film, the thickness of the Ti layer is required to be larger than those of concave and convex portions of the Al metallized film. This requirement is described in further details in the sections describing the anode junction in the embodiments described below. The Al metallized film should be selected according to the above-mentioned idea also in the embodiments described below.

Also the Ti metallized film is basically made of Ti, but impurities may be included in the Ti metallized film.

The metallized film containing at least either one or both of Sn and Ti as a main component corresponds to the reaction product layer describe above, and is formed in the production processes as described below.

(1) The first method comprises the steps of: forming a metallized film containing Al as a main component on a substrate mainly made of Si; forming a Ti metallized film in succession; and furthermore jointing the Ti metallized film on the surface to a glass substrate by means of anode junction. The metallized film containing Ti as a main component is formed as described above. This method will be described in further details in "Detailed Description of the Embodiment".

(2) The second method comprises the steps of: forming a metallized film containing Al as a main component on a substrate mainly made of Si; forming an Sn metallized film in succession; and melting an Sn film on the surface and jointing a glass substrate thereto by means of anode junction. The metallized film containing Sn as a main component is formed as described above.

(3) The third method comprises the steps of: forming a metallized film containing Al as a main component on a substrate mainly made of Si; forming a metallized film containing Ti and Au in succession; forming a Sn metallized film on the Au metallized film in succession; and melting Sn and Au alloy to joint a glass substrate by means of anode junction. A compound containing at least one of Ti, Al, and Sn as a main component is formed. The specific example will be described in detail in the embodiments.

In the functional devices according to embodiments of the present invention, a gap between a concaved portion in a crystal grain boundary of the metallized film containing Al as a main component and the glass substrate is filled with a compound containing at least one of Ti, Al, Sn, and Au as a main component.

First Embodiment

Figure 2:
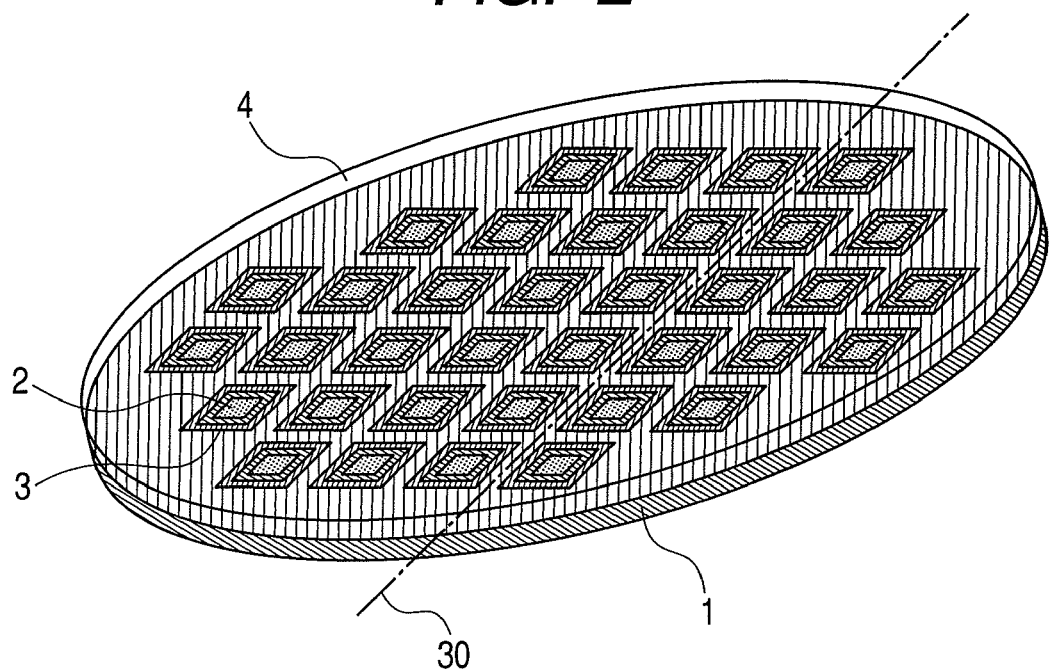
FIG. 2 is a perspective view illustrating outline of wafer-level packaging of the functional device according to the present invention, and an example of a dicing position is shown in the figure.

A first embodiment of the present invention is described with reference to FIGS. 1 to 7. FIG. 1 is a perspective view illustrating outline of packaging of a functional device at the wafer level. FIG. 2 is a perspective view illustrating outline of the packaging at the same wafer level, illustrating a line of dicing. Namely, functional devices 2 are formed on an Si substrate shown in FIG. 1, and a metallized film 3 is formed along an outer periphery of the functional device 2. A glass substrate 4 is jointed to the metallized film 3 for sealing by anode junction. After the anode junction is completed, as shown in FIG. 2, the packaging is cut along a dicing line 30 between the metallized films for sealing, and is divided into each functional device 2. In the example shown in FIG. 2, there is only one dicing line. It is needless to say that cutting is performed along each the dicing lines between the functional devices 2. The Si substrate 1 may be a monocrystal Si wafer, or an SOI wafer depending on a device to be manufactured, and in either case, a main component of the substrate is Si. In this specification, the expression of "substrate containing Si as a main component" is used in all of the embodiments.

A structure of the functional device is described in detail with reference to FIG. 3C. FIG. 3C is a cross-sectional view of a representative functional device. An AlN piezoelectric film 9 is formed between wiring and an electrode 8 on the Si substrate 1. A cavity 5 is provided below the AlN piezoelectric film 9 by etching the Si substrate 1. The Si substrate 1 is provided with a through-hole electrode 6 electrically connected to the wiring and the electrode 8, and the through-hole electrode 6 extends through the Si substrate 1. Furthermore, an electrode pad 7, which is used for soldering or the like, is formed on a rear surface of the Si substrate 1. Along an outer periphery of the functional device, on a surface of the Si substrate 1 on which the functional device is present, the metallized film 3 for sealing is formed. A glass substrate 4 is jointed to the metallized film 3 for sealing by means of anode junction. It is to be noted that also an oxide layer or the like not shown is formed on the surface of the Si substrate 1.

Figure 3C:
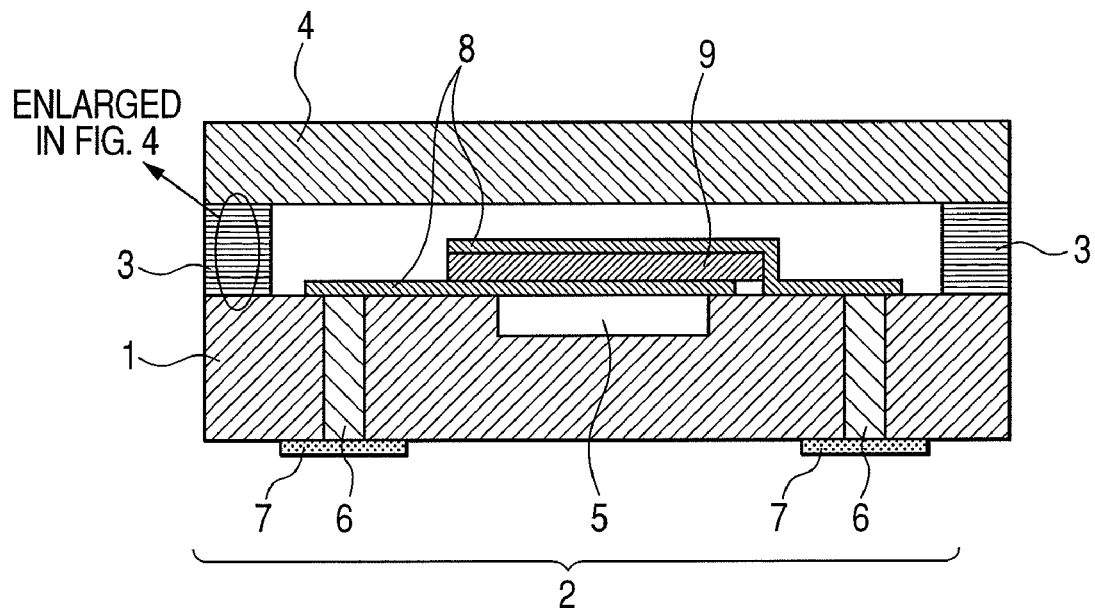
FIG. 3C is a cross-sectional view of the functional device according to the first embodiment of the present invention at still another manufacturing step thereof.
Figure 4:
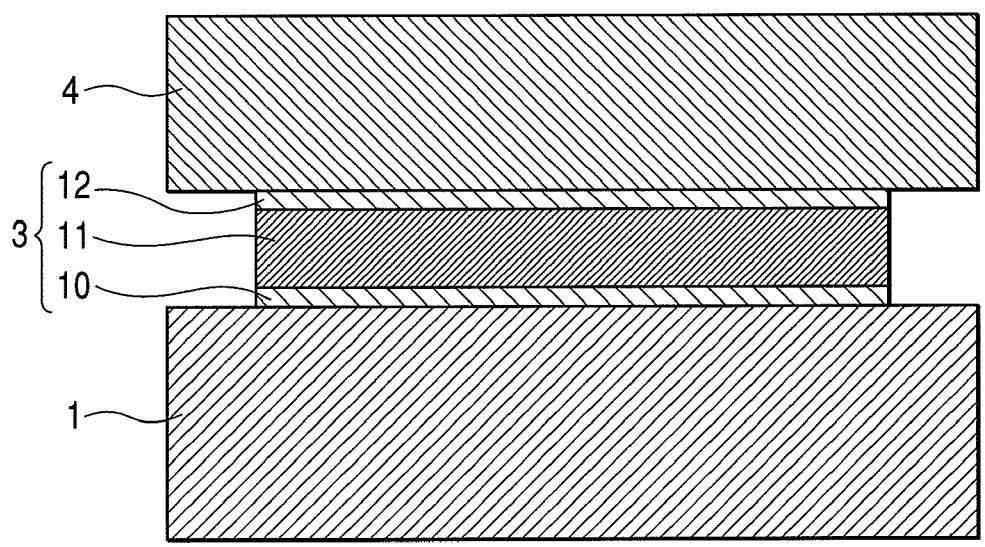
FIG. 4 is a cross-sectional view illustrating a laminated structure of a metallized film for sealing according to the first embodiment of the present invention.

A configuration of a metallized film for sealing is shown in FIG. 4. FIG. 4 is an enlarged view illustrating the area A shown in FIG. 3C. A Ti film 10 for adhesion is formed on the Si substrate 1, and an Al film 11 and a Ti film 12 are formed on the Ti film 10. The glass substrate 4 is jointed to the Ti film 12 by means of anode junction.

Figure 3A:
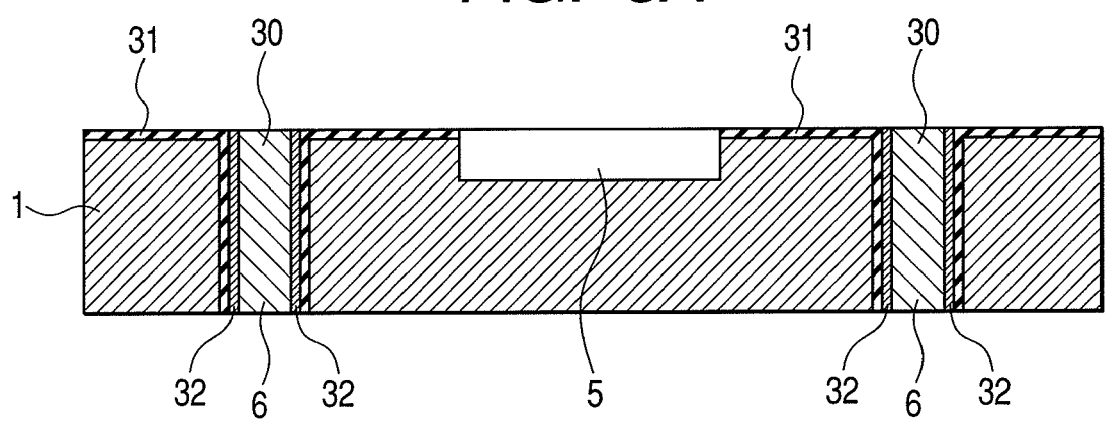
FIG. 3A is a cross-sectional view of the functional device according to a first embodiment of the present invention at a manufacturing step thereof.
Figure 3B:
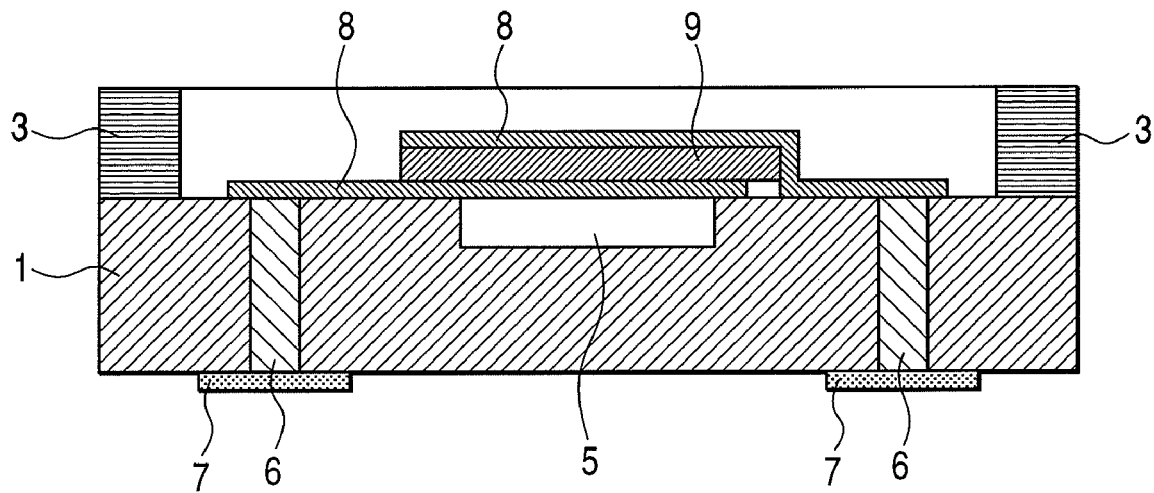
FIG. 3B is a cross-sectional view of the functional device according to the first embodiment of the present invention at another manufacturing step thereof.

FIGS. 3A to 3C are referred. At first, an example of the process for forming the structure as shown in FIG. 3C is described. At first, a resist mask is formed to provide a through-hole for the piecing electrode 6 on the Si substrate 1 by lithography. Then, a through-hole 30 is formed on the Si substrate 1 by dry etching. For insulation, the Si substrate 1 is oxidized by heating to form a thermally-oxidized film 31 on the surface. Then, a metallized film made of Ti or the like is formed inside and around the through-hole 30, for instance, by sputtering, thereby forming a metal film 32. Then a metal is filled in the through-hole 30. Preferably, metal plating including Cu and Ni is applied. The piecing electrode 6 gives influences to air-tightness of the functional device, and it is necessary to fill the metal without any clearance. Then opposite surfaces of the Si substrate 1 are polished, and protruding portions of the metal plating are removed for flattening the surfaces. It is to be noted that the thermally-oxidized film 31 and the metal film 32 are not shown in the figures for the purpose of simplification.

Then the cavity 5 is formed by wet or dry etching (Refer to FIG. 3A). When a SOI wafer is used on the Si substrate 1, $SiO_2$ present in the middle of substrate functions as a stopper form etching, so that a cavity having a uniformed depth can easily be obtained. When an Si wafer is used, sometimes slight roughness may be generated at a bottom of the cavity during the etching process.

Then a sacrifice layer is buried in the cavity so that the cavity will not cause any trouble in the subsequent process, but the sacrifice layer is removed afterward. For the formation of the sacrifice layer, such a material as a resist material showing the sufficient durability in the subsequent manufacturing steps may be used. Furthermore, surface of the Si substrate 1 are polished for flattening.

Then, patterns for wiring for the wiring, the electrode 8, and the electrode pad 7 are formed by photolithography. In this step, for instance, Ti metallized film is formed by sputtering and then Ni/Au plating is applied to a surface of the Ti film. In this case, proportions of thicknesses among the Ti, Ni, and Au layers are, for instance, 0.1 (Ti), 2 (Ni), and 2 (Au) (The unit is μm. This unit is used also in the descriptions below.) In other cases, metallized films of Ti(0.1)/Pt(0.2)/Au(0.5), Ti(0.1)/No(0.5)/Au(0.5) or the like may be formed by sputtering or by deposition method. In these cases, patterning can be formed by milling or by lifting off. When the wiring and the electrode 8 are formed, the electrode under the AlN piezoelectric film 9 is formed at first, and after the AlN piezoelectric film 9 is formed, a metallized film for another electrode is overlaid on the AlN piezoelectric film 9. In the steps, the electrode pad 7 is formed as are the wiring and the electrode 8.

The AlN piezoelectric film is formed on the wiring and the electrode 8 using the photo lithography and the technique for forming a thin film.

Then the metallized film 3 for sealing is formed (FIG. 3B). The metal is preferably supplied by sputtering or deposition. Patterning may be performed by milling by means of photo lithography, lifting off, or wet etching. In the case shown in FIG. 4, a Ti layer 10 is formed with a thickness of 0.1 μm, then an Al layer 11 is formed with a thickness of 5 μm, and furthermore a Ti film 12 is formed with a thickness of 0.2 μm thereon. Because the sufficient thickness is provided by the Al layer, the function device does not contact the glass substrate 4. IT is to be noted that the AL layer can be formed with the sufficient thickness not only by the dry techniques as described above, but also by plating. Because the size of convex and concave portions on the Al metallized film in this embodiment is not more than 0.2 μm, the thickness of the Ti metallized film formed on the Al metallized film is set to 0.2 μm.

The sacrifice layer formed in the cavity 5 is solved by a solvent so that it is removed. When this step is completed, a functional device is formed.

Then the glass substrate 4 is jointed to the metallized film 3 for sealing by means of anode junction (Refer to FIG. 3C).

The subsequent steps relate to air-tight sealing by jointing the glass substrate 4 to the metallized film 3 for sealing by means of anode junction. Anode junction is described in detail below. To realize the anode function, generally an Si wafer is overlaid on a glass substrate, an electrode is pressed to both a lower surface of the SI wafer and an upper surface of the glass substrate, then the entire structure is heated to about 400 degrees C., and a voltage is loaded to the structure for junction using the Si side as an anode, and the glass side as a cathode. By heating, alkali components such as Na contained in glass are easily dispersed. When a voltage is loaded to Si as an anode and to the glass as a cathode, the alkali components are ionized and dispersed. It is generally said that positive ions of Na are attracted to the upper surface of the glass substrate, i.e., to the cathode side, with a positive ion depleted layer formed at positions adjacent to an interface between the glass substrate and the Si wafer. Originally the region is electrically neutral, but the positive charge decreases because the positive ions are forcibly dispersed by application of a voltage, so that the region is negatively charged. Electrification of the region generates a further stronger electrostatic attraction force between the glass substrate and the Si wafer, and because of the stronger electrostatic attraction force, the Si wafer is tightly jointed to the glass substrate. At the same time, because oxygen contained in glass oxides Si on an interface between the Si substrate and the glass substrate, strong junction is provided.

The anode junction is applied for sealing, because a glass substrate is directly jointed to a metallized film for sealing and therefore the cost is low. In addition, a large amount of expensive precious metals is not used for forming the metallized films for sealing as described by referring to FIG. 4, and therefore air-tight sealing can be realized with low cost. Especially, employment of the Ti/Al/Ti metallized films is useful for reduction of the production cost. Because the metallized films are used for production of general semiconductor devices, investment on plant and equipment for forming new metallized films is not required, which is also beneficial for cost reduction.

In the case of anode junction between a glass substrate and an Si substrate, the joint section can is sealed air-tight relatively easily if the joint surfaces of the two substrates are polished to the roughness level of 1 nm or below. On the other hand, when a metallized film is formed on an Si substrate and the metallized film and a glass substrate are jointed to each other by anode junction, it is not easy to realize the high capability for air-tight sealing because the surfaces are not always flat.

Figure 5:
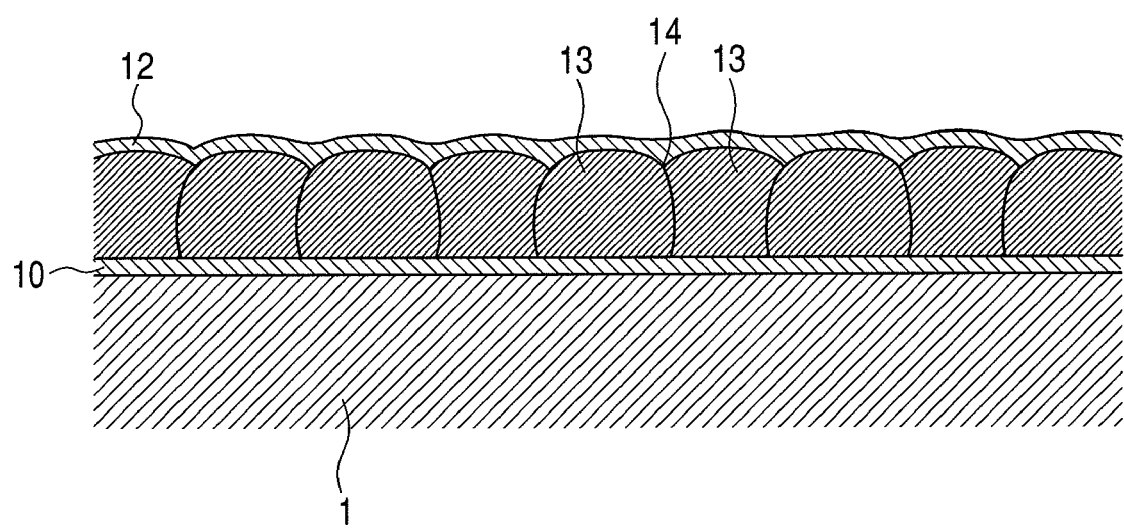
FIG. 5 is a cross-sectional view illustrating details of the metallized film for sealing according to the first embodiment of the present invention.
Figure 6:
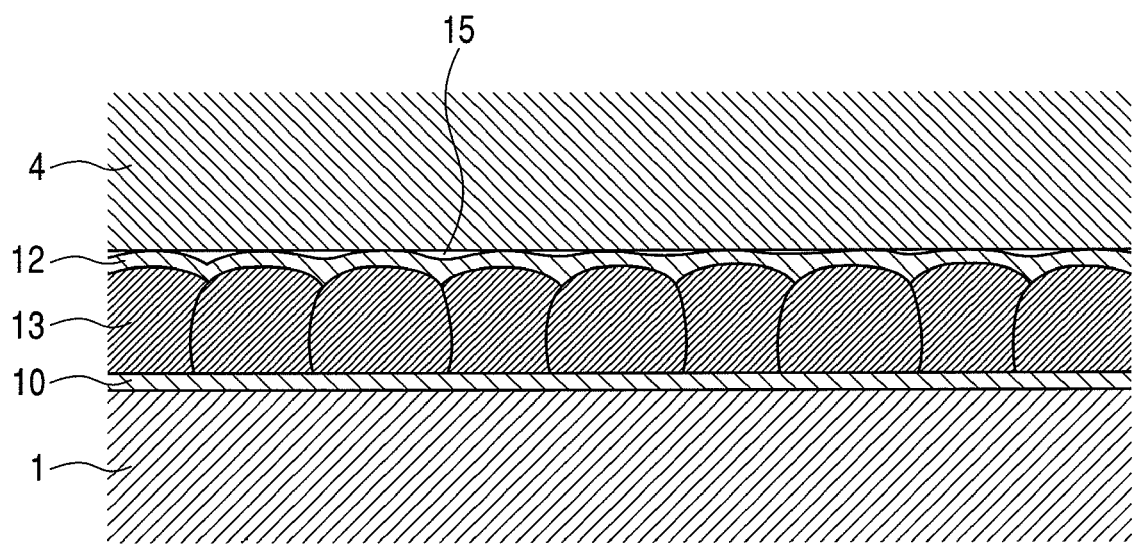
FIG. 6 is a cross-sectional view illustrating behaviors of the metallized film for sealing according to the first embodiment of the present invention during anode junction.
Figure 7:
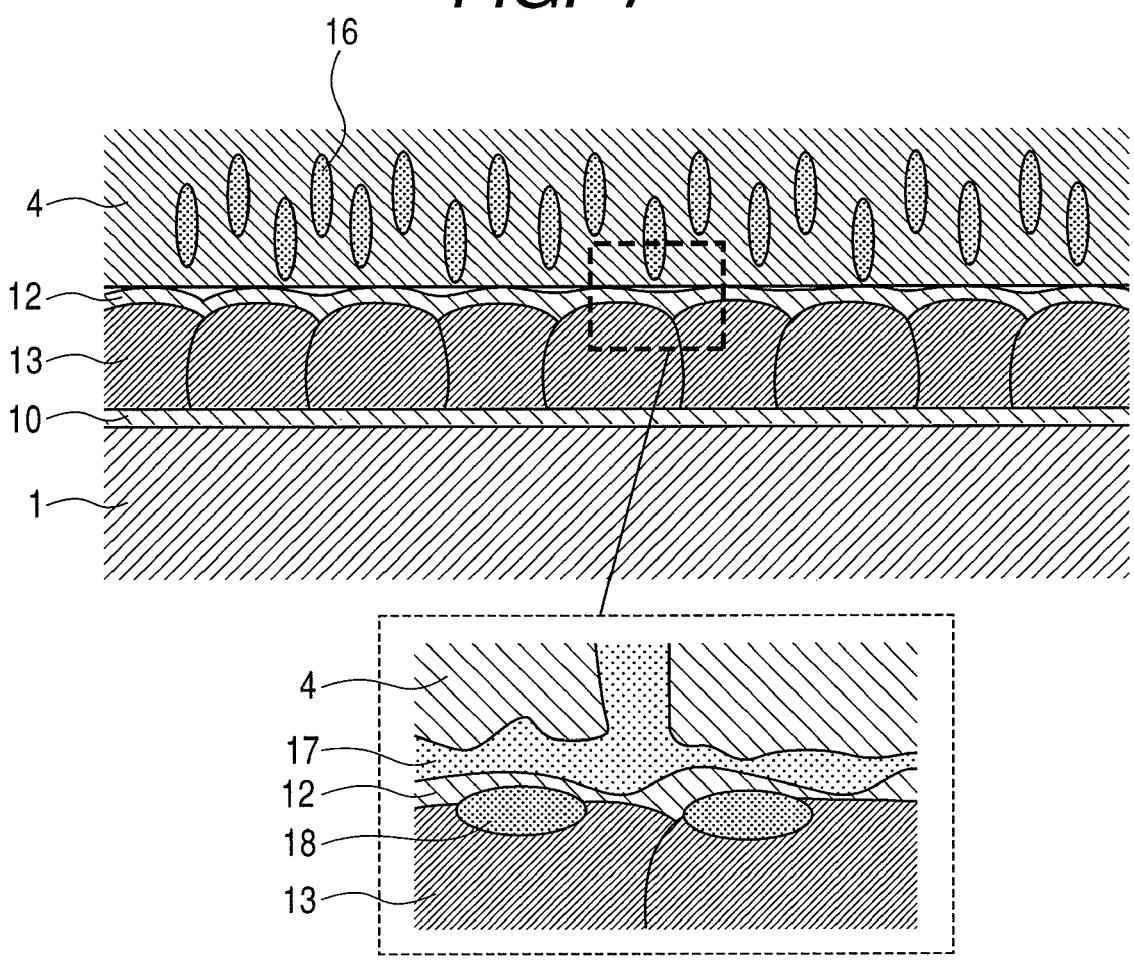
FIG. 7 is a cross-sectional view illustrating a mechanism enabling air-tight sealing of the metallized film for sealing according to the first embodiment of the present invention.

FIGS. 5 to 7 each schematically illustrate a state of an interface in the jointed portion when the metallized film 3 for sealing is jointed by anode junction. Each of the reference numerals has the same meaning in the figures. FIG. 5 shows a cross-sectional structure of a metallized film before junction. The Ti metallized film 10, the Al metallized film 13, and the Ti metallized film 12 are laminated on the Si substrate 1. From FIGS. 5 to 7, it is understood that there are crystal grains 13 and a crystal grain boundary 14, and also that the crystal grain boundary 14 is slightly depressed. Also in the Ti metallized film, a number of fine crystal grains are formed, so that the similar crystal grain boundary is formed. However, because the Al metallized film is thicker, the grain boundary is depressed more in the Al metallized film.

The Al metallized film is formed as described above, and then a Ti metallized film is formed on the Al metallized film, because a certain degree of thickness is required for the Al metallized film for sealing. On the other hand, the Ti metallized film is not so thick, because the Ti film has a high membrane stress, and when the thickness is extremely larger, the Ti film may sometimes be peeled off. In contrast, because Al is soft, the membrane stress is small, and therefore the Al film is hardly peeled off even when the thickness is large. Also because the thickness is large, a depressed portion of the crystal grain boundary is formed, and a clearance is formed even when the glass substrate 4 is placed thereon. This clearance sometimes spoils the air-tightness even after anode junction is performed. When a thickness of the Ti film is small, because the resistance is high, the resistance can be lowered by forming the AL film. From the viewpoints as described above, it is preferable that a thickness of an Al film is in the range from 0.1 to 5 μm and a thickness of the Ti film be in the range from 0.01 μm to about 0.3 μm.

FIG. 6 is a cross-sectional view of a structure in which a TI film is formed on an AL metallized film and the glass substrate 4 is overlaid on the Al metallized film. In the state shown in FIG. 6, still anode junction is not performed, and therefore a clearance 15 is present. When anode junction is performed, the state as shown in FIG. 7 is provided. Ti atoms are ionized at a section where the T film contacts the glass substrate, and the Ti atoms are dispersed in the glass substrate. Junction proceeds so that projections generated by Al crystal grains are scraped off. For instance, when anode junction is performed at a temperature of 400 degrees C. and under a voltage of 1000 V, junction proceeds rapidly with Ti atoms dispersed. In this case, as shown in the partially enlarge view in FIG. 7, the depressed portion in the Al crystal grain boundary is filled with Ti or Ti—Al compounds (which are generated through reactions between Ti and Al), and a layer of Ti oxides is formed on the interface, which enables junction with high air tightness. The conditions for junction to achieve the effects in the embodiment as described above vary according to a type of glass used for junction, and in the case of boric silicate which is generally used for anode junction, the temperature is generally in the range from about 260 to 500 degrees C., while the voltage is in the range from 400 to 1500 V. Basically, when the temperature and the voltage are higher, junction may be performed with ease. When the temperature is higher than 660 degrees C. at which Al melts, the entire device may be destroyed. To prevent the breakage as described above, taking heat resistance of other portions into consideration, the temperature for junction is preferably 500 degrees C. or below. When an excessively high voltage is applied, dielectric breakdown will occur in the glass substrate to cause breakage of the device, and therefore the voltage to be applied is preferably about 1500 V or below.

Even when a surface of the metallized for sealing is covered with Al, if it is possible to fill a depressed section in the crystal grain boundary with any means, the air tightness can be improved, but in this embodiment, a Ti metallized film is formed on the surface to positively utilize the reaction shown in FIG. 7. In the case of anode junction between an Al substrate and a glass substrate, Al is dispersed into the glass substrate less as compared to Ti. Furthermore, Al and Ti react with oxygen contained in glass to form an oxide layer, but In the case of an Al substrate, a thickness of the oxide layer is small, while In the case of a Ti substrate, the thickness is relatively large. It is conceivable that the difference as described above is caused due to a difference in a crystallographical structure of the generated oxide. Oxygen atoms in glass are dispersed in the Ti oxide and grows at the side thereof so that increase of TI oxides may promote a reaction of burying the depressed section.

AS described above, the functional device according to the first embodiment of the present invention comprises a function element formed by processing a substrate mainly made of Si; a metallized film for sealing formed along an outer periphery of the function element; and a glass substrate jointed to the metallized film for sealing by means of anode junction. In the functional device, a metallized film mainly made of Ti is formed on a metallized film mainly made of Al, which makes it possible to provide air-tight sealing with low cost.

Second Embodiment

A second embodiment of the present invention is described with reference to FIG. 8 and FIG. 9. In the second embodiment, the metallized film 3 for sealing in the first embodiment is replaced with another one, and other portions of and processes in the second embodiment are the same as those in the first embodiment.

Figure 8:
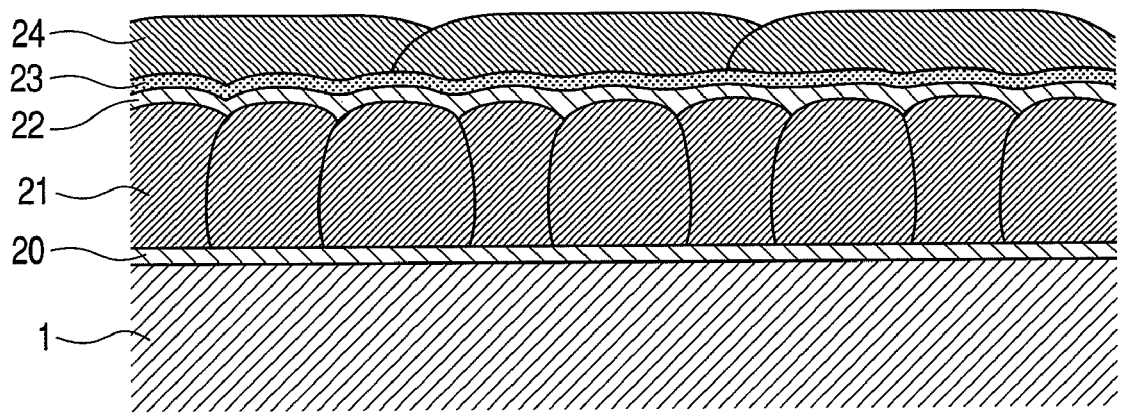
FIG. 8 is a cross-sectional view illustrating details of a metallized film for sealing according to a second embodiment of the present invention.

FIG. 8 is a cross-sectional view of a structure in which a Ti metallized film 22, an Au metallized film 23, and an Sn metallized film 24 are formed on an Al crystal grain layer 21. In the second embodiment, an Sn metallized film is formed on a surface of the laminated body, because, when anode junction is performed by heating Sn to a melting point of 232 degrees C. or more, the melted Sn fills a depressed portion caused in the Al crystal grain boundary.

The Ti metallized film 22 and the Au metallized film 23 are formed on the Al crystal grain layer 21 to prevent the Sn metallized film 24 from peeling off when the Sn metallized film 24 is formed, for instance, by deposition. However, after the Al metallized film 21 is formed, if it is possible to successively form the Sn metallized film 24 without taking out the Al metallized film 21 into the atmosphere, it is not necessary to form the Ti metallized film 22 and the Au metallized film 23. Generally, a preferable film thickness for each metallized film is as follows: 0.1 to about 5 μm for the Al metallized film, 0.01 to about 0.3 μm for the Ti metallized film, 0.05 to about 0.5 μm for the Au metallized film, and 0.1 to about 2 μm for the Sn film.

Figure 9:
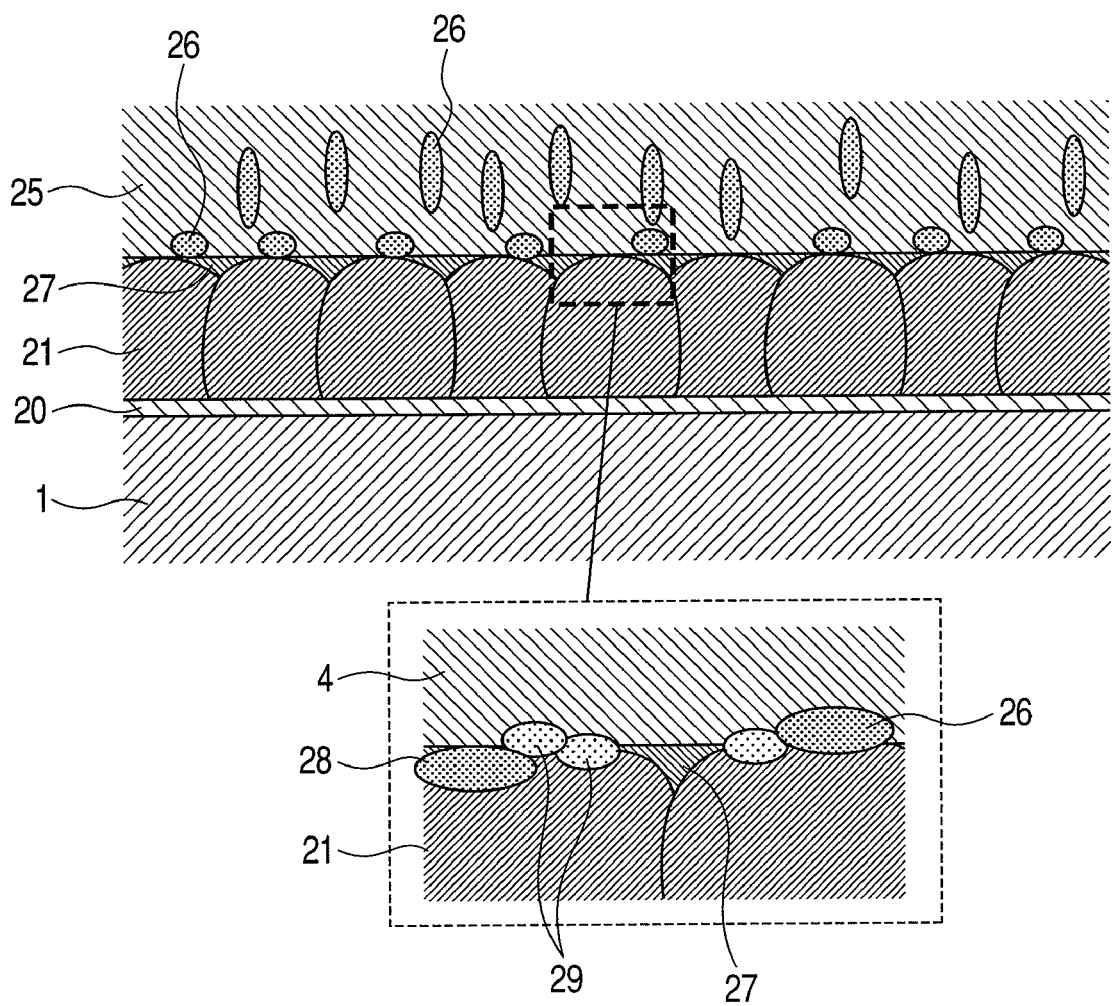
FIG. 9 is a cross-sectional view illustrating a mechanism enabling air-tight sealing of the metallized film for sealing according to the second embodiment of the present invention.

FIG. 9 is a cross-sectional view illustrating a state after anode junction is completed. At first, Sn melts, and Sn other than that used for filling a depressed portion in the Al crystal grain boundary runs off to outside of the sealing section. Au atoms in the Au metallized film 24 are dissolved in the Sn metallized film, whereas the Sn metallized film contains a low density of Au. Also Ti atoms in the Ti metallized film 22 are dispersed in the glass substrate and converted to Ti oxides 26. As shown in the partially enlarged view in FIG. 9, the joint section includes Ti oxides 26, Ti—Al compounds 28, Al oxides 29, Sn compounds 27 formed when Sn reacts with other metals, and the like.

In the first embodiment, a clearance caused by a depressed portion in a metallized film for sealing is eliminated by dispersing Ti into a glass substrate. However, in second embodiment, since the depressed portion is filled with melted Sn, air tightness can be obtained even at a relatively low temperature. Because a melting point of Sn is 232 degrees C., when junction is performed at a temperature higher than the melting point, the effect according to this embodiment can be obtained. Conditions for the junction are the same as those in the first embodiment, and the temperature for junction is generally in the range from 260 to 500 degrees C., while the voltage for junction is in the range from 400 to 1500 V. In this embodiment, however, because air-tight sealing can be performed by melting Sn. Therefore the junction should preferably be performed, for instance, at a temperature of 300 degrees C. and under a voltage of 1000 V.

Third Embodiment

Figure 10:
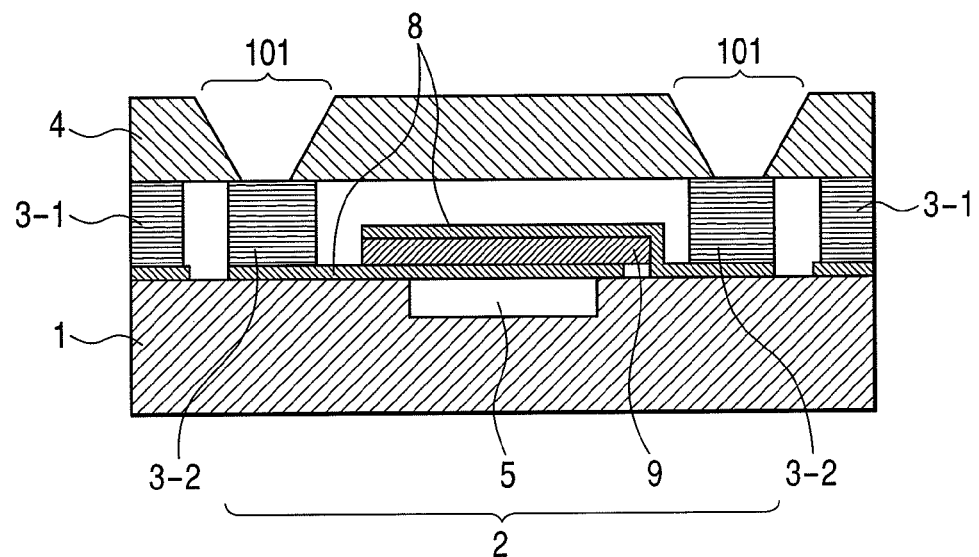
FIG. 10 is a cross-sectional view illustrating a functional device according to a third embodiment of the present invention.

A third embodiment of the present invention is described with reference to FIG. 10. In the third embodiment, electrodes of a functional device are connected to the outside through a through-hole on a glass substrate. As shown in the cross-sectional of the device in FIG. 10, the glass substrate 4 is provided with a through-hole 101 beforehand. On the other hand, the Si substrate 1 is formed with metallized films for sealing 3-1 and 3-2 on the wiring and the electrode 8 connected to the AlN piezoelectric film 9, at two positions, i.e., at a position associated with the through-hole 101 and at a position outside the through-hole 101. Then glass around the through-hole 101 and the metallized film 3 for sealing are jointed to each other by anode junction. The electrodes can be connected to the outside electrode via the through-hole 101 without forming a through-type electrode on the Si substrate, which is advantageous for reduced cost.

When the metallized film 3-1 for sealing around the function device and the metallized film for sealing 3-2 electrically connected to the AlN piezoelectric film are connected to the glass substrate 4, air tightness of the glass substrate 4 can be enhanced. The glass substrate around the through-hole 101 and the metallized film 3-2 for sealing can be completely jointed to each other by anode junction such that the through-hole 101 is provided in a plane where the metallized film 3-1 completely covers the Si substrate.

The metallized films for sealing 3-1 and 3-2 may have the same structure as those described in the first and second embodiments. By forming metallized films having the same configuration as the wiring and the electrode 8 under the metallized film 301 in the outer side, a height of the metallized film for sealing 3-1 can be made equal to that of the metallized film for sealing 302.

Also in the third embodiment, like in the first embodiment, the temperature for junction is preferably in the range from about 260 to 500 degrees C., while the voltage for junction is preferably in the range from 400 to 1500 V.

Like in the embodiments described above, by forming a metallized film for sealing along an outer periphery of a functional device and also jointing a glass substrate to the metallized film for sealing by anode junction, a low-cost functional device can be provided. The configuration of the metallized film for sealing according to the present invention is not limited to the FBAR filter described in detailed in the embodiments above, and the present invention can be applied to all of MEMS devices requiring air-tight sealing.

Fourth Embodiment

Figure 11:
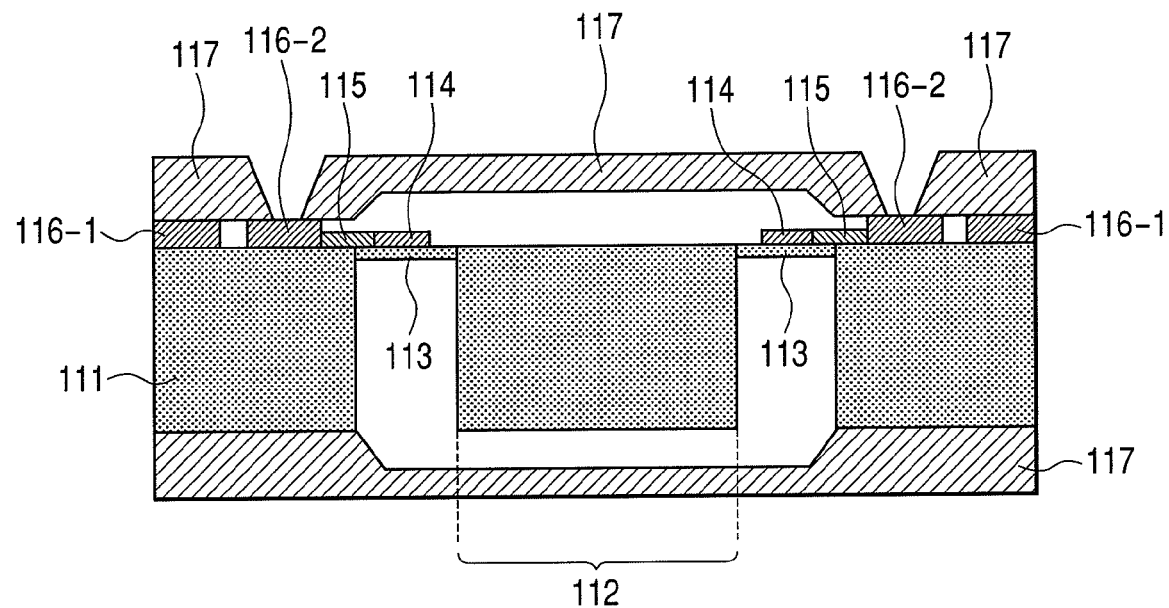
FIG. 11 is a cross-sectional view illustrating a functional device according to a fourth embodiment of the present invention.

A fourth embodiment of the present invention is described with reference to FIG. 11. FIG. 11 is a cross-sectional view illustrating a device in which a piezoelectric element is used. Patent document 1 describes an air-tight sealing structure for an acceleration sensor. FIG. 7 in Patent document 1 illustrates, as a example of the related art, a structure in which substrates each functioning as a cover plate are placed on and under and jointed to an acceleration sensor with an adhesive agent. Furthermore, Patent document 1 describes a method of air-tight sealing by using a glass substrate having the substantially same thermal expansion coefficient as that of Si and jointing the glass substrate to a substrate to a substrate with a functional device formed thereon by means of anode function. However, this document does not describe in detail the structure for connecting electrodes to outside without spoiling air-tight sealing.

The fourth embodiment of the present invention provides a structure in which electrodes are connected to outside without spoiling air-tight sealing by jointing a glass substrate to an Si substrate with a functional element formed thereon by means of anode junction.

As shown in FIG. 11, a spindle 112 and a beam 112 are formed by etching an Si substrate 111. The beam 113 is formed with a piezoelectric element 114 in advance. Wiring 115 is connected to the piezoelectric element 114, and a metallized film for sealing 116-2 functioning as an electrode is also connected to the wiring 115. In addition, a metallized film for sealing 116-1 is formed along an outer periphery of the metallized film for sealing 116-2. The number of metallized films varies depending on a type of a functional device based on the MEMS, and basically a first metallized film for sealing is formed around a functional device, and a metallized film for sealing functioning as an electrode is formed in the inner side from the second metallized film for sealing. Then the junction is performed so that a through-hole on the glass substrate is positioned in an area where the metallized film for sealing functioning as an electrode covers the Si substrate. This configuration is the same as that in the third embodiment.

In the fourth embodiment, after a functional device as an acceleration sensor is formed by processing an Si substrate 111, the functional device is held between and jointed to a glass substrates 117 by anode junction for providing air-tight sealing. The structure of the metallized film for air-tight sealing may be the same as those described in the first and second embodiments. Also in the fourth embodiment, like in the first embodiment, the temperature for junction is preferably in the range from about 260 to 500 degrees C., while the voltage for junction is preferably in the range from 400 to 1500 V.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A functional device comprising,
a function element section,
a Si substrate with at least its surface comprised of Si, including said function element section,
a glass substrate, and
a first metal film for sealing said functional element section;
said first metal film for sealing being formed between said Si substrate and said glass substrate,
wherein said Si substrate and said glass substrate are jointed to each other by an anode junction via said first metal film for sealing; and
wherein said first metal film for sealing comprises a metal film containing Al as a main component and Ti compounds formed between said metal film containing Al and said glass substrate and in contact with both said metal film containing Al and said glass substrate.

2. The functional device according to claim 1,
wherein said Ti compounds are formed in said glass substrate.

3. The functional device according to claim 2,
wherein Ti—Al compounds and Ti oxides are formed at the side of said glass substrate from at said metal film containing Al.

4. The functional device according to claim 1,
wherein Sn compounds are formed at the side of said glass substrate from at said Ti compounds.

5. The functional device according to claim 1, wherein:
a second metal film for sealing is formed inside of said Si substrate from said first metal film for sealing in a plane of said Si substrate, said second metal film for sealing being electrically connected to said function element section,
said glass substrate includes through-holes at positions corresponding to said second metal film for sealing in a plane of said Si substrate,
said first metal film for sealing is jointed to said glass substrate by anode junction, and
said second metal film for sealing is jointed to said glass substrate by an anode junction around the through-holes.

6. The functional device according to claim 1, wherein said first metal film further comprises a metal film containing Ti as a main component formed for adhesion between the metal film containing Al as a main component and the Si substrate.

* * * * *